(12) United States Patent
Komatsuzaki

(10) Patent No.: US 6,707,702 B1
(45) Date of Patent: Mar. 16, 2004

(54) VOLATILE MEMORY WITH NON-VOLATILE FERROELECTRIC CAPACITORS

(75) Inventor: Katsuo Komatsuzaki, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/293,195

(22) Filed: Nov. 13, 2002

(51) Int. Cl.⁷ .............................................. G11C 11/22
(52) U.S. Cl. ...................... 365/145; 365/156; 365/154; 365/190
(58) Field of Search ................. 365/145, 154, 365/156, 190, 205

(56) References Cited

U.S. PATENT DOCUMENTS

| | | | |
|---|---|---|---|
| 4,809,225 A | 2/1989 | Dimmler et al. ............ | 365/145 |
| 4,853,893 A | 8/1989 | Eaton, Jr. et al. ........... | 365/145 |
| 4,910,708 A | * 3/1990 | Eaton, Jr. et al. ........... | 365/145 |
| 4,914,627 A | * 4/1990 | Eaton, Jr. et al. ........... | 365/145 |
| 4,918,654 A | * 4/1990 | Eaton, Jr. et al. ........... | 365/145 |
| 5,680,344 A | 10/1997 | Seyyedy ..................... | 365/145 |
| 6,069,816 A | 5/2000 | Nishimura .................. | 365/145 |
| 6,141,242 A | 10/2000 | Hsu et al. ................... | 365/182 |
| 6,259,126 B1 | 7/2001 | Hsu et al. ................... | 257/298 |
| 6,263,398 B1 | 7/2001 | Taylor et al. ................ | 711/3 |
| 6,285,575 B1 | 9/2001 | Miwa ......................... | 365/145 |

OTHER PUBLICATIONS

"A Survey of Circuit Innovations in Ferroelectric Random–Access Memories", Ali Sheikholeslami and P. Glenn Gulak, *Proceedings of the IEEE*, vol. 88, No. 3, May 2000, pp. 667–689.

* cited by examiner

*Primary Examiner*—Andrew Q. Tran
(74) *Attorney, Agent, or Firm*—Jacqueline J. Garner; W. James Brady, III; Frederick J. Telecky, Jr.

(57) ABSTRACT

Memory apparatus and methods are provided for storing data in a semiconductor device, comprising volatile and non-volatile portions, where the non-volatile portion comprises two ferroelectric capacitors coupled with one of two internal nodes in the volatile memory portion. Apparatus is also disclosed wherein first and second ferroelectric capacitors are coupled with the first internal node of the volatile portion, and third and fourth ferroelectric capacitors are coupled with the second internal node of the volatile portion.

22 Claims, 10 Drawing Sheets

VOLATILE MEMORY WITH NON-VOLATILE FERROELECTRIC CAPACITORS

FIELD OF INVENTION

The present invention relates generally to semiconductor memory devices and more particularly to methods and memory apparatus with non-volatile ferroelectric capacitors for storing data in a semiconductor device.

BACKGROUND OF THE INVENTION

In semiconductor memory devices, data is read from or written to the memory using address signals and various other control signals. In random access memories ("RAMS"), an individual binary data state (e.g., a bit) is stored in a volatile memory cell, wherein a number of such cells are grouped together into arrays of columns and rows accessible in random fashion along bitlines and wordlines, respectively, wherein each cell is associated with a unique wordline and bitline pair. Address decoder control circuits identify one or more cells to be accessed in a particular memory operation for reading or writing, wherein the memory cells are typically accessed in groups of bytes or words (e.g., generally a multiple of 8 cells arranged along a common wordline). Thus, by specifying an address, a RAM is able to access a single byte or word in an array of many cells, so as to read or write data from or into that addressed memory cell group.

Two major classes of random access memories include "dynamic" (e.g., DRAMs) and "static" (e.g., SRAMs) devices. For a DRAM device, data is stored in a capacitor, where an access transistor gated by a wordline selectively couples the capacitor to a bit line. DRAMs are relatively simple, and typically occupy less area than SRAMs. However, DRAMs require periodic refreshing of the stored data, because the charge stored in the cell capacitors tends to dissipate. Accordingly DRAMs need to be refreshed periodically in order to preserve the content of the memory. SRAM devices, on the other hand, do not need to be refreshed. SRAM cells typically include several transistors configured as a flip-flop having two stable states, representative of two binary data states. Since the SRAM cells include several transistors, however, SRAM cells occupy more area than do DRAM cells. However, SRAM cells operate relatively quickly and do not require refreshing and the associated logic circuitry for refresh operations.

A major disadvantage of SRAM and DRAM devices is volatility, wherein removing power from such devices causes the data stored therein to be lost. For instance, the charge stored in DRAM cell capacitors dissipates after power has been removed, and the voltage used to preserve the flip-flop data states in SRAM cells drops to zero, by which the flip-flop loses its data. Accordingly, SRAMs and DRAMs are commonly referred to as "volatile" memory devices. Non-volatile memories are available, such as Flash and EEPROM. However, these types of non-volatile memory have operational limitations on the number of write cycles. For instance, Flash memory devices generally have life spans from 100 K to 10 MEG write operations.

Recently, non-volatile ferroelectric RAM devices have been developed, which are commonly referred to as FERAMs or FRAMs. FERAM cells employ ferroelectric cell capacitors including a pair of capacitor plates with a ferroelectric material between them. Ferroelectric materials have two different stable polarization states that may be used to store binary information, where the ferroelectric behavior follows a hysteresis curve of polarization versus applied voltage. FERAMs are non-volatile memory devices, because the polarization state of a ferroelectric cell capacitor remains when power is removed from the device. Ferroelectric memories provide certain performance advantages over other forms of non-volatile data storage devices, such as Flash and EEPROM type memories. For example, ferroelectric memories offer short programming (e.g., write access) times and low power consumption. However, access times in SRAM and DRAM type memories are significantly shorter than in FERAM devices.

Hybrid memory devices have been developed, which include volatile and non-volatile portions. For example, memories have been constructed combining SRAM cells with ferroelectric devices, wherein the memory may be operated as an SRAM, with the capability to backup or save the volatile SRAM data to ferroelectric capacitors associated with the SRAM cells. The non-volatile data may thereafter be retrieved from the ferroelectric capacitors and transferred to the SRAM cells. In the interim, the SRAM cells may be operated as normal SRAM, even while non-volatile data resides in the ferroelectric capacitors. However, problems exist in current hybrid memory devices. For example, in transferring data between the SRAM cell and the associated ferroelectric capacitors, the relative capacitance of the internal SRAM cell nodes and the ferroelectric devices reduces the voltage margins for sensing data and for polarizing the ferroelectric capacitors. Accordingly, there is a need for improved hybrid memory cell apparatus combining SRAM or other volatile memory cells with non-volatile ferroelectric capacitors for storing data in a semiconductor device.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One aspect of the invention relates to methods and memory apparatus for storing data in a semiconductor device, where the apparatus comprises a volatile portion and a non-volatile portion. The volatile portion is adapted to store a binary volatile data state and comprises first and second internal nodes. The non-volatile portion is coupled with the first and second internal nodes of the volatile portion and is adapted to store a binary non-volatile data state. The non-volatile portion comprises first and second ferroelectric capacitors coupled with the first internal node of the volatile portion, as well as third and fourth ferroelectric capacitors coupled with the second internal node of the volatile portion.

The volatile portion may be any form or type of volatile memory cell having two internal nodes, where the electrical state of the nodes is indicative of a binary data state stored therein. In one example, the volatile portion comprises an SRAM cell, including a first inverter comprising a first input coupled with the second internal node and a first output coupled with the first internal node, as well as a second inverter comprising a second input coupled with the first internal node and a second output coupled with the second internal node. Switching circuits may be provided to selectively couple first and/or second supply nodes in the SRAM cell with a supply voltage or a ground.

A control circuit may also be included to provide timing and control signals to the volatile and non-volatile portions during memory operations in the memory apparatus. In one implementation of the invention, the first and third ferroelectric capacitors are coupled with a first plateline signal, and the second and fourth ferroelectric capacitors are coupled with a second plateline signal. This facilitates provision of different plateline voltage signals thereto during FERAM read and write operations. In addition, the non-volatile portion may further comprise a coupling circuit for selectively coupling the first and second ferroelectric capacitors with the first internal node and for coupling the third and fourth ferroelectric capacitors with the second internal node according to a ferroelectric enable signal from the control circuit.

Another aspect of the invention provides a memory apparatus for storing data in a semiconductor device, which comprises an SRAM memory cell including first and second internal nodes and first and second supply nodes, and which is adapted to store a binary volatile data state. The apparatus further comprises a non-volatile memory cell coupled with the first and second internal nodes of the SRAM cell and adapted to store a binary non-volatile data state. The non-volatile portion comprises first and second ferroelectric capacitors coupled with the first internal node of the volatile portion, and third and fourth ferroelectric capacitors coupled with the second internal node of the volatile portion. The apparatus also includes a first switching circuit adapted to selectively couple the first supply node with a supply voltage or a ground and a second switching circuit adapted to selectively couple the second supply node with the supply voltage or ground.

Yet another aspect of the invention provides a memory apparatus, comprising an SRAM memory cell including first and second internal nodes and first and second supply nodes, and first and second ferroelectric capacitors coupled with one of the first and second internal nodes of the SRAM memory cell, the ferroelectric capacitors being adapted to store a binary non-volatile data state. Still another aspect of the invention provides methods for storing data in a semiconductor device, in which first and second plateline signals are provided to different ferroelectric capacitors in the non-volatile memory portion, wherein the second plateline signal is different from the first plateline signal in at least a portion of one of a non-volatile read operation or a non-volatile write operation.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
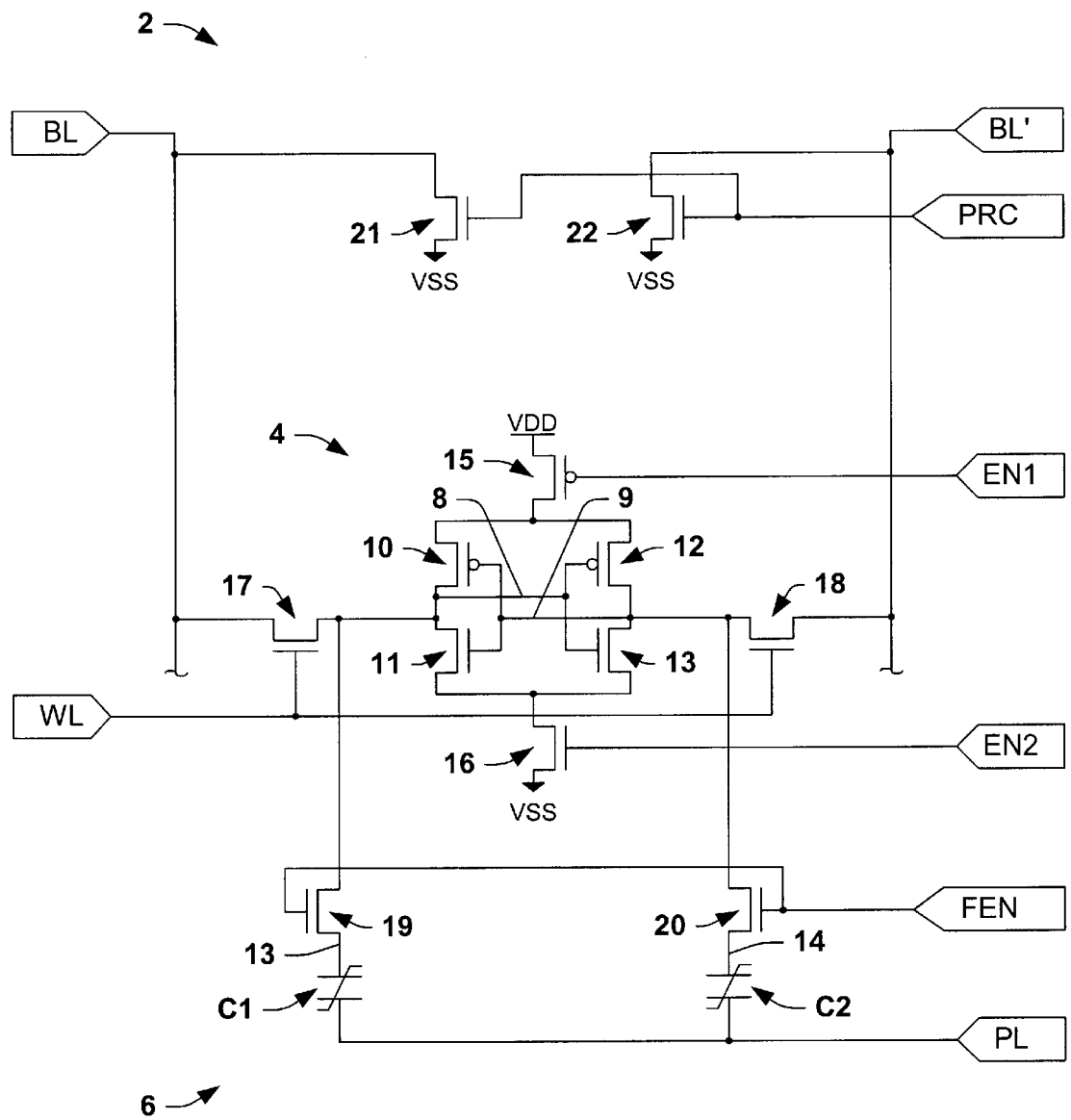
FIG. 1 is a schematic diagram illustrating a conventional hybrid memory device having a volatile SRAM cell and ferroelectric capacitor elements for non-volatile data storage.

The present invention will now be described with reference to the attached drawings, wherein like reference numerals are used to refer to like elements throughout. The invention relates to a memory apparatus comprising a volatile portion and a non-volatile portion, in which two ferroelectric capacitors are coupled to an internal node of the volatile portion. In order to better appreciate one or more features of the invention, a conventional hybrid memory device is hereinafter illustrated and described with respect to FIG. 1.

FIG. 1 illustrates a conventional hybrid memory cell 2 consisting of a CMOS SRAM cell 4 and a non-volatile (e.g., shadow) portion 6. The SRAM cell 4 includes two PMOS transistors 10 and 12 and two NMOS transistors 11 and 13 forming a pair of cross-coupled inverters, enabled by a PMOS transistor 15 and an NMOS transistor 16 according to enable signals EN1 and EN2, respectively. Internal SRAM nodes 8 and 9 are cross-coupled to the inverters, with the node 8 coupled with the gates of transistors 12 and 13, and the node 9 coupled with the gates of transistors 10 and 11. In addition, transistors 17 and 18 are provided to couple the nodes 8 and 9 to complementary bitlines BL and BL', respectively, wherein the gates of the access transistors 17 and 18 are coupled to a wordline WL. The nodes 8 and 9 are further coupled through a pair of NMOS transistors 19 and 20 with the upper terminals of ferroelectric capacitors C1 and C2 at nodes 13 and 14, respectively, for non-volatile data storage in the portion 6, wherein the transistors 19 and 20 are gated by a ferroelectric enable signal FEN.

The lower terminals of the ferroelectric capacitors C1 and C2 are coupled to a single plateline signal PL. In addition, two transistors 21 and 22 are provided for selectively precharging the bitlines BL and BL', respectively, to ground (VSS) according to a control signal PRC. In normal (e.g., volatile SRAM) operation of the cell 2, the enable signals EN1 and EN2 are active, whereby the transistor 15 pulls the upper source/drain terminals of transistors 10 and 12 to VDD and the transistor 16 grounds the lower source/drain terminals of SRAM transistors 11 and 13 to VSS. The plateline signal PL and the enable signal FEN are low, whereby the volatile and non-volatile portions 4 and 6 are decoupled from one another. The isolated volatile portion 4 thus operates as a conventional SRAM cell, which is externally accessed via the bitlines BL, BL' and the wordline WL to read and write data into the flip-flop formed by the transistors 11, 13, 10 and 12.

In an FERAM write, data may be written to the non-volatile portion 6 from the SRAM portion 4. For example, where the data in the SRAM portion 4 is such that node 8 is at a low voltage level (VSS) and the node 9 is at a high voltage level (VDD), the SRAM data may be stored in the ferroelectric capacitors C1 and C2 as follows. The signal FEN initially is brought high to allow the ferroelectric capacitors C1 and C2 to charge up with EN1 and EN2 enabled, and the plateline signal PL is initially low. The voltage at a non-volatile portion node 14 rises when the transistor 20 turns on, and the ferroelectric capacitor C2 is programmed to a first or "high" polarization state. The plateline signal PL is then brought high to charge the C1 by bringing the non-volatile portion node 13 low when the transistor 19 turns on. In this manner, the reversed voltage potential across the ferroelectric capacitor C1 causes it to be polarized to an opposite second or "low" polarization state.

In this manner, the high node 9 of the SRAM cell portion 4 corresponds to C2 being programmed to the "high" polarization state, and the low level at the node 8 of the static cell 4 has been written as a "low" polarization state to C1. Similar operation is found where the data in the SRAM is of an opposite binary value, such as where node 9 is at a low voltage level (VSS) and node 8 is at a high voltage level (VDD). Once the SRAM data has been stored in the non-volatile portion 6, the memory may thereafter be powered down without any data loss because the polarization states of capacitors C1 and C2 are maintained, thereby preserving the data. However, the SRAM portion 4 may optionally be operated as a volatile memory thereafter, without disturbing the non-volatile data in the portion 6, such as by pulling the plateline signal PL and the signal FEN low, to isolate or decouple the portions 4 and 6 from one another.

To read the non-volatile data into the SRAM 4, the signal PRC and the wordline WL are brought high to precharge the nodes 8 and 9 to ground through the transistors 17, 18, 21, and 22. The plateline PL is held low and the FEN signal is brought high to couple the capacitor nodes 13 and 14 to the SRAM nodes 8 and 9 at 0 V. Then, the precharging transistors 21 and 22 are turned off by bringing the PRC signal low, and the wordline WL is brought low to turn transistors 17 and 18 off. The plateline signal PL is brought high to provide voltages across the ferroelectric capacitors C1 and C2 such that the ferroelectric capacitor having a "high" polarization state will experience a polarization reversal. The SRAM cell is then enabled by activation of EN1 and EN2 to sense the data from the ferroelectric capacitors C1 and C2, and to latch the sensed data state. Ideally, the capacitance of the internal nodes 8 and 9 of the SRAM 4 cell is sufficiently high so that the voltages at nodes 8 and 9 stay low enough for at least partial reversal of polarization to occur for the ferroelectric capacitor C2 which had been written to the "high" polarization state. If so, the voltage at node 9 will be slightly higher than at node 8 during the FERAM read where the SRAM 4 is used as a sense amp.

However, the inventor has appreciated that if the SRAM capacitance is insufficient to ensure partial reversal of polarization of the ferroelectric capacitor at the "high" polarization state (e.g., C2 in this example), then the resulting voltage difference between the internal SRAM nodes 8 and 9 during sensing is small, possibly below the amount needed for proper sensing by the SRAM 4. In the device 2, the load capacitance is largely determined by the MOS transistors 10, 12, 11, and 13 of the SRAM portion 4. This capacitive imbalance condition effectively reduces the sense margin of the device 2 and may lead to incorrect reading of the non-volatile data (data flip), particularly where there are sensitivity imbalances in the transistors of the SRAM portion 4. For example, the transistors 11 and 13 may have different performance characteristics due to pattern size variation or due to impurity variations in the MOS channels thereof, requiring more signal charge to overcome the imbalance. If large performance characteristic imbalances exist between the transistors 11 and 13, for example, more signal charge is required to ensure correct sensing.

One possible solution is to apply higher voltage levels to the ferroelectric capacitors C1 and C2 during write or restore operations. However, this consumes more power. In another solution, the relative capacitances of the SRAM transistors and the ferroelectric capacitors may be changed, for example, wherein the SRAM transistors 10, 12, 11, and 13 are made larger to maintain enough bias voltage to the ferroelectric capacitors during FERAM read and write operations. However, this approach occupies more layout area. Alternatively, the ferroelectric capacitors may be made smaller, but limits are reached at which the ferroelectric capacitor size is limited by the minimum feature size of the fabrication process.

The device 2 in FIG. 1 also suffers from quick self-latching when the initial equalization via the precharge transistors 21 and 22 is not complete and/or where the ferroelectric capacitors C1 and C2 are not closely matched. For example, small differences in the capacitors C1 and C2 may upset the sensing operation during FERAM read operations prior to signal charge extraction if insufficient voltage is applied to extract the signal charge. Also, during FERAM write operations, plateline bias changes may upset the data state of the SRAM 4, causing the wrong state to be stored in the ferroelectric capacitors C1 and C2. Since the node capacitances of the ferroelectric capacitors C1 and C2 are relatively large compared with the current sink capability of the SRAM transistors, if the plateline signal PL is biased too rapidly, the previous polarization state stored in the capacitors C1 and C2 may overwrite the SRAM data state.

For instance, in the above example, it is possible that the previous state of ferroelectric capacitor C2 was "low." In this case, a polarization reversal current will be drawn from the internal node 9 of the SRAM cell 4 during an FERAM write operation, which must be supplied by the transistor 12 such that the voltage at node 9 does not drop below the switching voltage of the SRAM 4. The magnitude of this current may be controlled by the relative device sizes of the capacitor C2 and the transistor 12. Similarly, with respect to the node 8 and capacitor C1, the transistor 11 must be of sufficient size to prevent the voltage at node 8 from exceeding the SRAM switching voltage, wherein the current through the capacitor C1 should be less than the current to flip the SRAM data during an FERAM write operation. However, as noted above, increasing the size of the transistors 10 or 12 increases the die area occupied by the device 2, and there are limitations on the amount of reduction possible in the size of the ferroelectric capacitors C1 and C2.

Figure 2A:
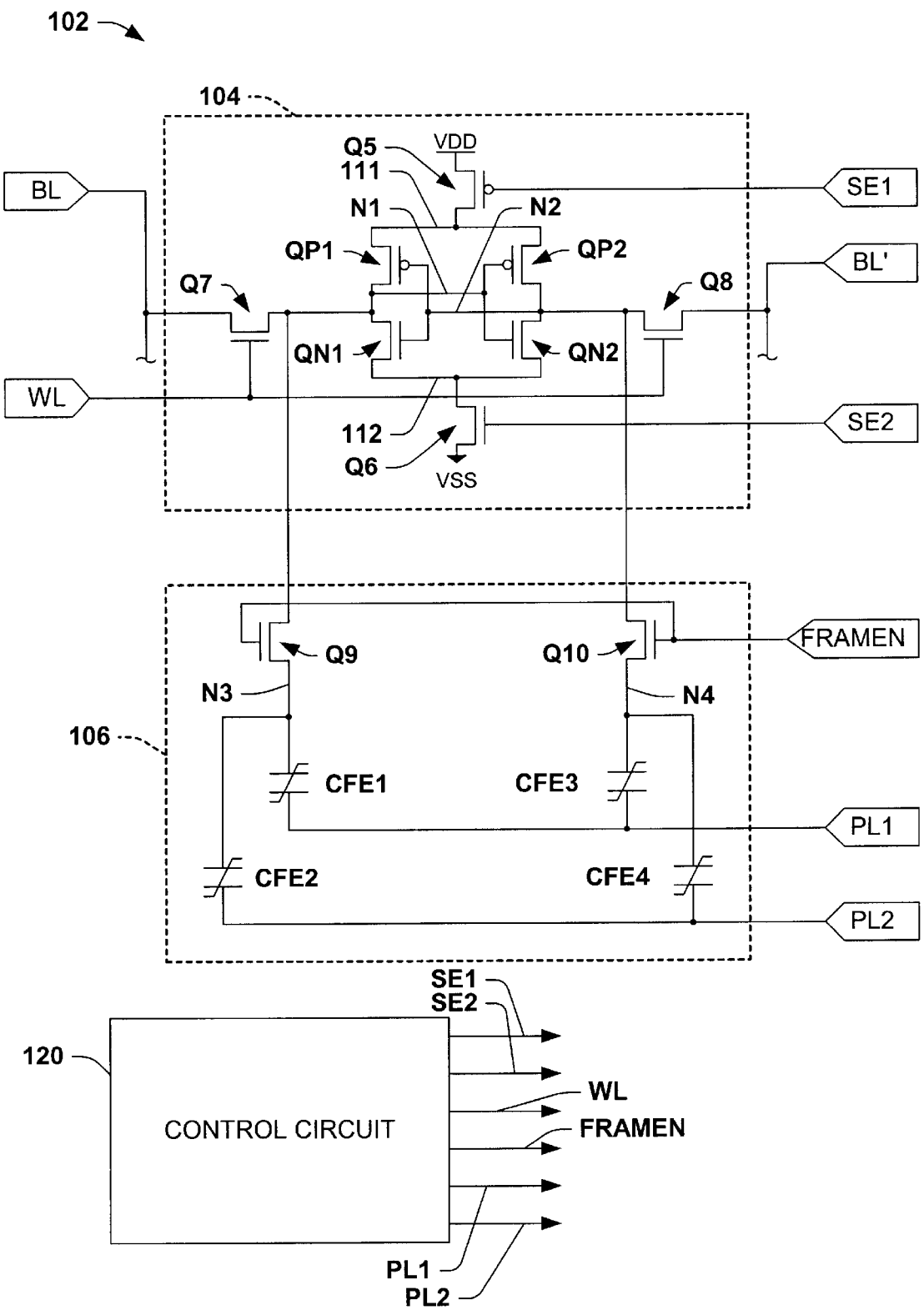
FIG. 2A is a schematic diagram illustrating an exemplary memory apparatus in accordance with an aspect of the present invention.

The present invention provides memory apparatus combining the speed and utility of volatile memory cells, such as SRAM cells, with the non-volatility of ferroelectric capacitors, by which one or more of the above shortcomings of the conventional device 2 may be mitigated or overcome. Referring now to FIG. 2A, an exemplary hybrid memory apparatus 102 is illustrated for storing data in a semiconductor device. The apparatus 102 comprises a volatile SRAM memory portion 104 adapted to store a binary volatile data state and a non-volatile (e.g., ferroelectric) memory portion 106 adapted to store a binary non-volatile data state.

The exemplary SRAM cell 104 comprises a flip-flop (e.g., a pair of cross coupled inverters) formed by two PMOS transistors QP1 and QP2 and two NMOS transistors QN1 and QN2. A first inverter comprising QP1 and QN1 has an input coupled with an internal SRAM node N2 and an output coupled with another internal SRAM node N1. A second inverter comprises transistors QP2 and QN2, which has an input coupled with the node N1 and an output coupled with N2. The nodes N1 and N2 are cross-coupled to the gates of the inverter transistors, with N1 coupled with the gates of QP2 and QN2, and N2 coupled with the gates of QP1 and QN1.

A PMOS transistor Q5 is operable according to a first enable signal SE1 from a control circuit 120 to couple the top source/drain terminals of QP1 and QP2 at a first supply node 111 with a supply voltage VDD. An NMOS transistor Q6 selectively grounds the bottom source/drain terminals of the transistors QN1 and QN2 at a second supply node 112 to VSS (e.g., 0 V) according to a second enable signal SE2. External access to the device 102 is provided by two access transistors Q7 and Q8 coupling the nodes N1 and N2 to complementary bitlines BL and BL', respectively, wherein the gates of the access transistors Q7 and Q8 are coupled to a wordline WL from the control circuit 120.

The non-volatile portion 106 comprises first and second ferroelectric capacitors CFE1 and CFE2 selectively coupled with the first internal node N1, as well as third and fourth ferroelectric capacitors CFE3 and CFE4, respectively, coupled with the second internal node N2, via NMOS transistors Q9 and Q10 according to a FERAM enable control signal FRAMEN. In the illustrated implementation, the SRAM internal node N1 is coupled with the upper terminals of ferroelectric capacitors CFE1 and CFE2 at a non-volatile portion node N3 via the NMOS transistor Q9. In addition, the SRAM internal node N2 is coupled with the upper terminals of the ferroelectric capacitors CFE3 and CFE4 at a non-volatile portion node N4 via the NMOS transistor Q10.

The ferroelectric capacitor CFE1 is coupled between a non-volatile portion node N3 and a first plateline signal PL1 from the control circuit 120, and CFE2 is coupled between the node N3 and a second plateline signal PL2. CFE3 is coupled between another non-volatile node N4 and the first plateline signal PL1, and CFE4 is coupled between the node N4 and the second plateline signal PL2. Precharging circuitry (not shown) may be provided for selectively precharging or equalizing the bitlines BL and BL' and/or the internal SRAM nodes N1 and N2 to ground or another voltage level, similar to the precharge transistors 21 and 22 above under control of the control circuit 120.

Figure 2B:
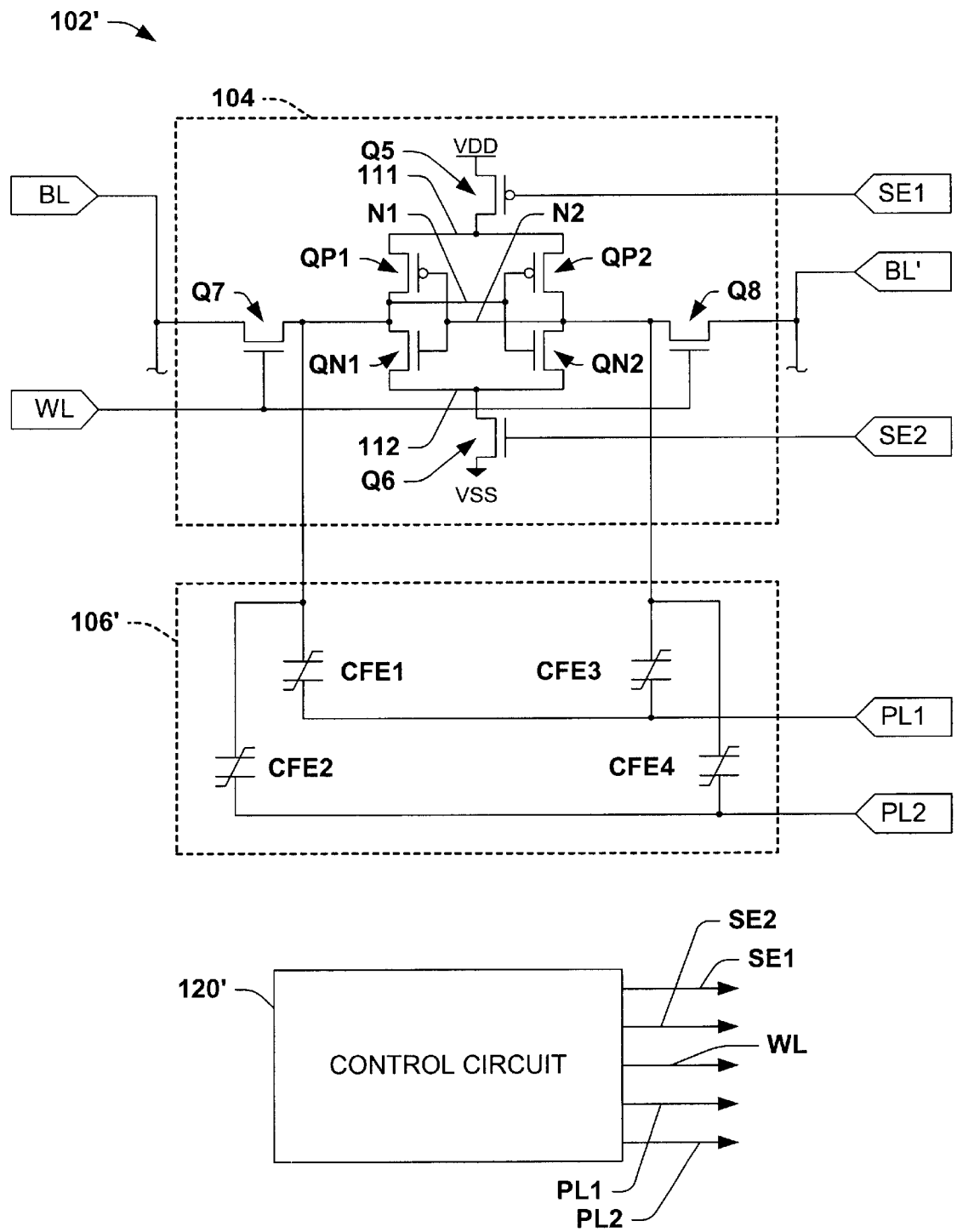
FIG. 2B is a schematic diagram illustrating another exemplary memory apparatus in accordance with an aspect of the present invention.

Referring also to FIG. 2B, an another exemplary hybrid memory apparatus 102' is illustrated, comprising a volatile portion 104 as described above, and a non-volatile memory portion 106' adapted to store a binary non-volatile data state. In the apparatus 102', the portion 106' is similar to the non-volatile portion 106 described above with respect to FIG. 2A, without the coupling transistors Q9 and Q10, wherein the ferroelectric capacitors thereof are coupled directly with the internal SRAM nodes N1 and N2. In addition, the apparatus 102' comprises a control circuit 120' similar in most respects to the control circuit 120 above, without a ferroelectric ram enable (FRAMEN) signal.

Figure 3A:
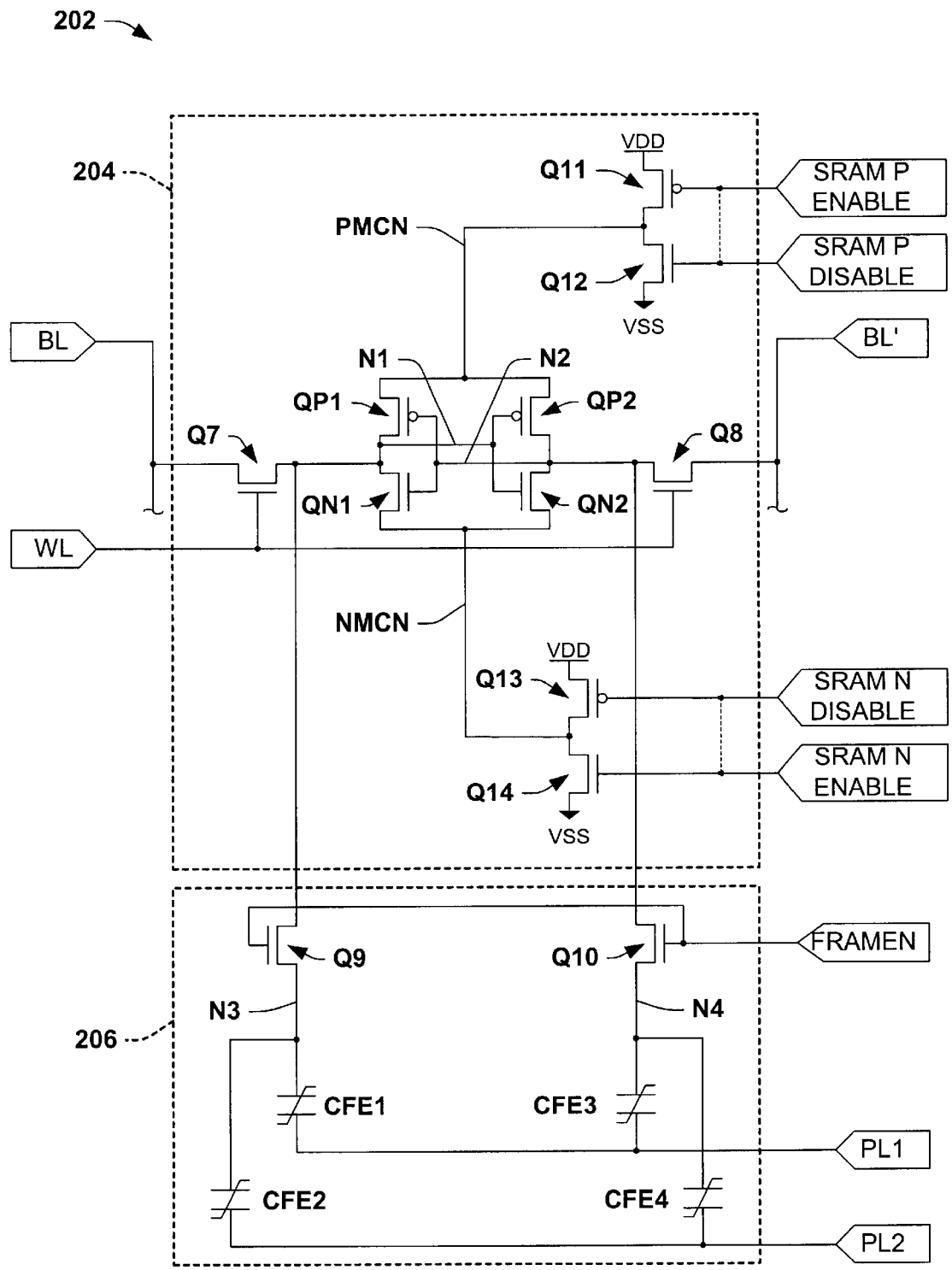
FIGS. 3A and 3B provide a schematic diagram illustrating a portion of another exemplary memory apparatus in accordance with the invention.
Figure 3B:
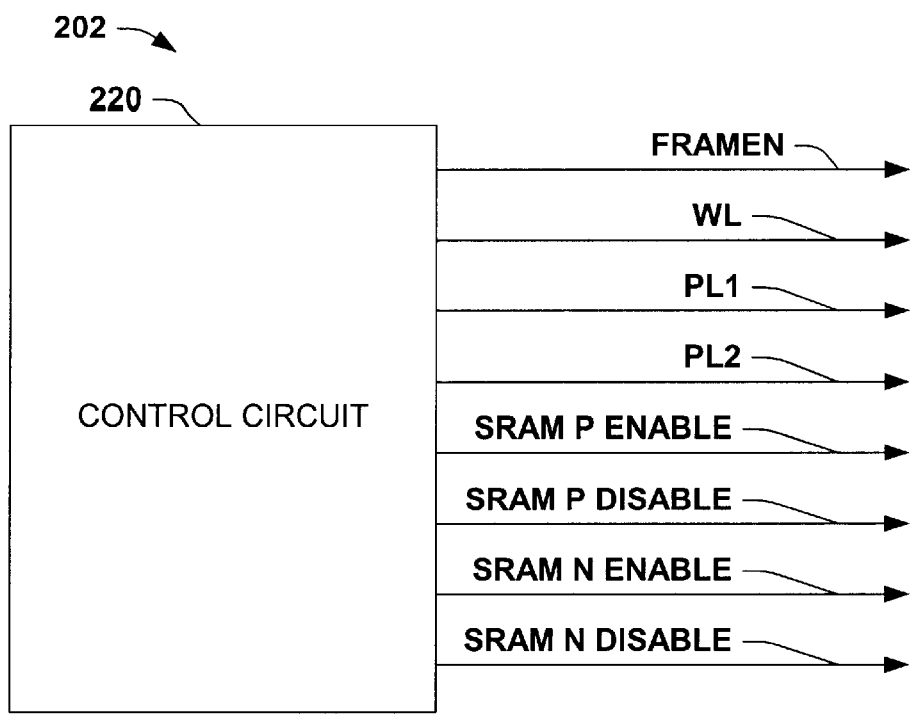
Figure 3D:
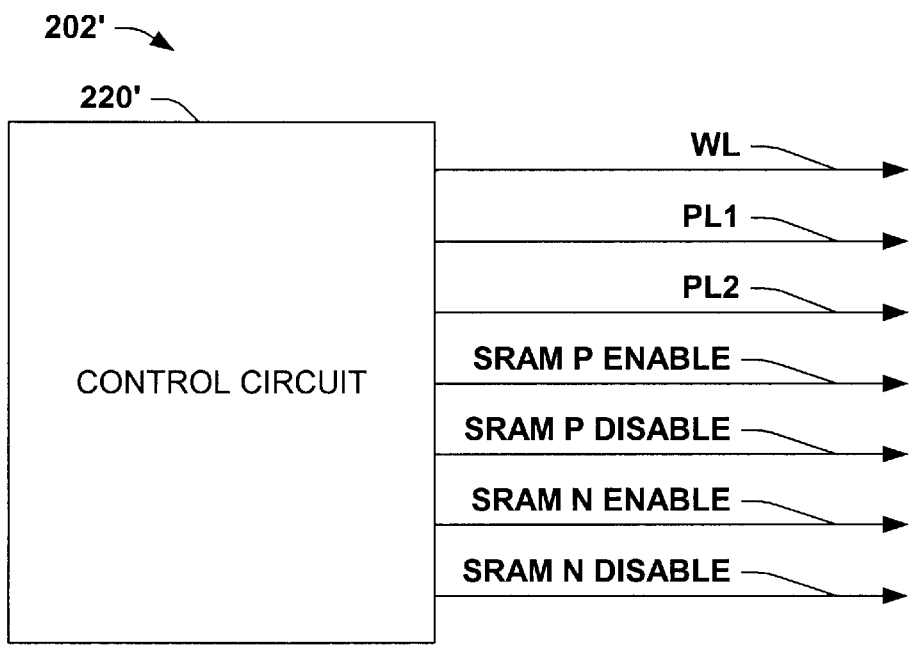
FIGS. 3C and 3D provide a schematic diagram illustrating a portion of yet another exemplary memory apparatus in accordance with the invention.
Figure 3C:
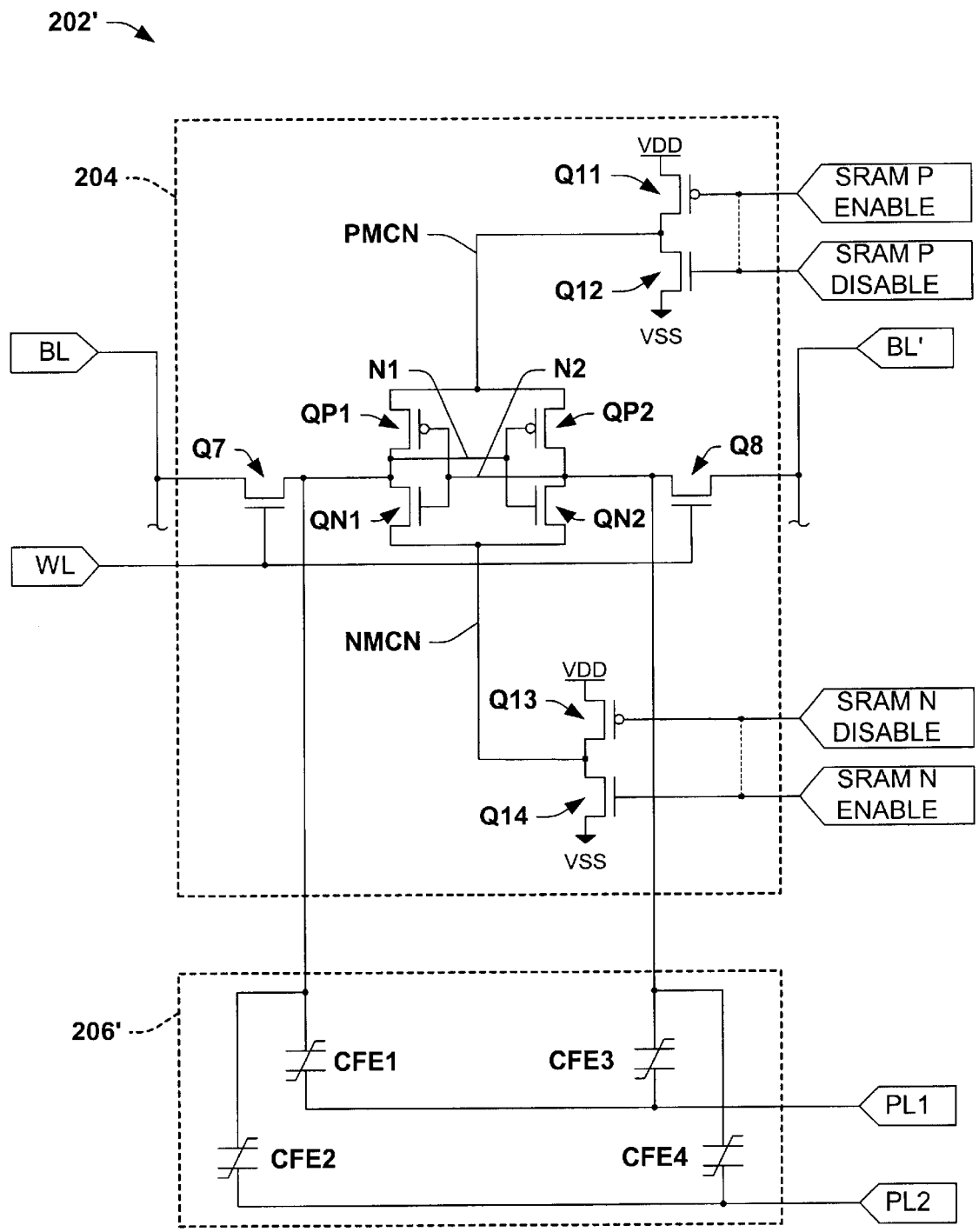

Referring now to FIGS. 3A–6, another exemplary memory apparatus 202 is illustrated in FIGS. 3A and 3B in accordance with the present invention, and an alternate implementation 202' is illustrated in FIGS. 3C and 3D. In FIGS. 3A and 3B, the apparatus 202 comprises volatile and non-volatile portions 204 and 206, respectively, having certain features and components similar to those of the apparatus 102 of FIG. 2A. In addition, the volatile portion 204 further provides a first switching circuit comprising transistors Q11 and Q12 adapted to selectively couple a first SRAM supply node PMCN (e.g., common to the PMOS SRAM transistors QP1 and QP2) with one of a supply voltage (VDD) and a ground (VSS). The SRAM portion 204 further comprises transistors Q13 and Q14 forming a second switching circuit adapted to selectively couple a second SRAM supply node NMCN (e.g., common to both SRAM NMOS transistors QN1 and QN2) with one of the supply voltage and the ground.

The transistor Q11 selectively couples the first supply node PMCN with VDD according to a first SRAM enable signal SRAM P ENABLE from a control circuit 220 (FIG. 3B), where the control circuit 220 provides other timing and control signals in the device 202, including FRAMEN, WL, PL1, PL2, and others illustrated and described herein. The transistor Q12 operates to selectively couple the first supply node PMCN with VSS according to a first SRAM disable signal SRAM P DISABLE from the control circuit 220. In the second switching circuit associated with the second supply node NMCN, the transistor Q13 selectively couples the second supply node NMCN with VDD according to a second SRAM disable signal SRAM N DISABLE, and the transistor Q14 selectively couples NMCN with ground according to a second SRAM enable signal SRAM N ENABLE from the control circuit 220. In one example, the signals SRAM P ENABLE and SRAM P DISABLE may be the same signal, and the signals SRAM N ENABLE and SRAM N DISABLE may likewise be a single signal.

An alternative implementation is illustrated in FIG. 3C and 3D, wherein a hybrid memory apparatus 202' comprises a volatile portion 204 as described above, and a non-volatile memory portion 206' similar in many respects to the non-volatile portion 206 in FIG. 3A, without the coupling transistors Q9 and Q10. Thus, in the apparatus 202' of FIGS. 3C and 3D, the ferroelectric capacitors are coupled directly with the internal nodes N1 and N2 of the volatile portion 204. The apparatus 202' further comprises a control circuit 220' (FIG. 3D) similar to the control circuit 220 of FIG. 3B, without a ferroelectric ram enable (FRAMEN) signal.

Figure 4:
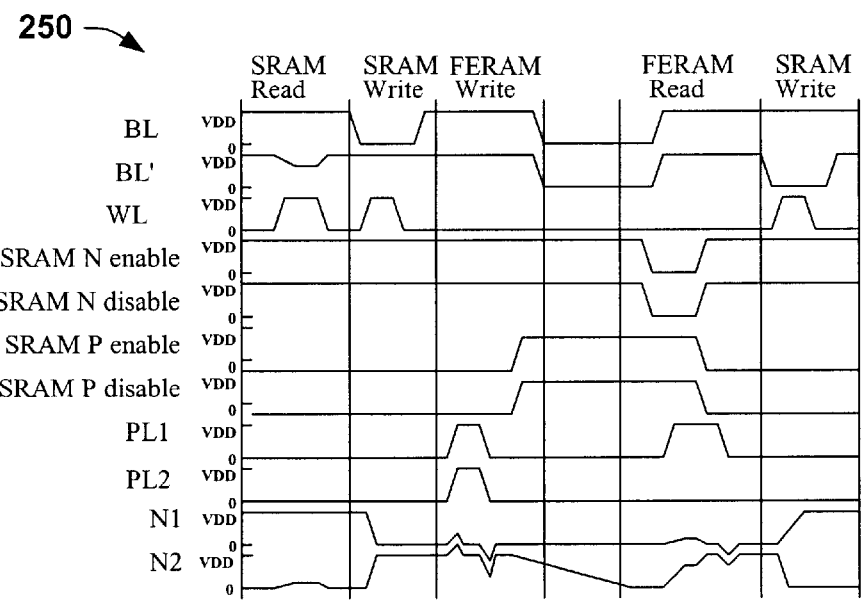
FIGS. 4-6 provide exemplary waveform timing diagrams illustrating operation of the exemplary memory apparatus of FIGS. 3C and 3D.

Referring also to FIG. 4, a timing diagram 250 illustrates exemplary operation of the apparatus 202' during volatile (e.g., SRAM) operation and non-volatile operation involving reading and writing of volatile and non-volatile data, respectively. It is noted that the exemplary apparatus 102' of FIG. 2B may also be operated generally as described hereinafter according to the signals of the timing diagram 250 in FIG. 4 or variations thereof. In normal (e.g., volatile) operation of the cell 202' as an SRAM memory cell element, the control signals SRAM P ENABLE and SRAM P DISABLE are high and the signals SRAM N ENABLE and SRAM N DISABLE are low (e.g., signals SE1 is low and SE2 is high in FIG. 2). The plateline signals PL1 and PL2 are low. The apparatus 202' is externally accessed via the complementary bitlines BL and BL' and the wordline WL to read and write data into the flip-flop formed by the cross-coupled SRAM inverters comprising the transistors QN1, QN2, QP1 and QP2.

The cell apparatus 202' alternatively may be operated in non-volatile fashion to perform FERAM read and write operations to transfer data between the portions 204 and 206'. In an FERAM write, for example, data from the volatile portion 204 is copied to or retrieved from the ferroelectric capacitors CFE1 and CFE2. To illustrate, the following description assumes that the volatile data in the SRAM portion 204 is such that node N1 is at a low voltage level (VSS) and node N2 is at a high voltage level (VDD). However, it will be appreciated that the apparatus 202' operates in complementary fashion for the opposite SRAM data state (e.g., as does the exemplary apparatus 102' of FIG. 2B). PMCN is pulled high through Q11 and NMCN pulled low through Q14, and the plateline signals PL1 and PL2 are initially low.

In an FERAM write operation, with the plateline signals PL1 and PL2 remaining low as the voltage at the internal SRAM node N2 rises, the capacitors CFE3 and CFE4 will be polarized to a first or "high" polarization state. To charge the other ferroelectric capacitors CFE1 and CFE2, the plateline signals PL1 and PL2 are pulsed high, as illustrated in FIG. 4. Since the internal node N1 is low, the voltage across the ferroelectric capacitors CFE1 and CFE2 provides an opposite or "low" polarization state therein. The plateline pulses are then terminated by the control circuit 220' pulling PL1 and PL2 low again, and the SRAM P ENABLE and SRAM P DISABLE signals are brought high to ground the SRAM supply node PMCN.

In this manner, the high voltage at the internal SRAM node N2 corresponds to CFE3 and CFE4 being programmed to the "high" polarization state, and the low level at the other internal SRAM node N1 has been written as a "low" polarization state to CFE1 and CFE2. Similar operation is found where the data in the SRAM portion 204 is of an opposite binary value, such as where the internal node N2 is at a low voltage level (VSS) and the internal node N1 is at a high voltage level (VDD). Once the SRAM data has been stored in the non-volatile portion 206', the memory may thereafter be powered down without any data loss because the polarization states of capacitors CFE1, CFE2, CFE3, and CFE4 are maintained in the ferroelectric material thereof, thereby preserving the non-volatile data state. Alternatively, the SRAM portion 204 may be operated again as a volatile memory, without disturbing the non-volatile data in the portion 206'.

An FERAM read operation may also be performed, for example, upon powerup, or during normal operation as desired, under control of the circuit 220. The SRAM internal nodes N1 and N2 are precharged or equalized to VSS (e.g., ground). The platelines PL1 and PL2 are initially held low and the wordline WL is brought low to turn Q7 and Q8 off. With SRAM P ENABLE and SRAM P DISABLE high, the control circuit 220 then brings SRAM N ENABLE and SRAM N DISABLE low to pull the node NMCN to VDD, and the plateline signal PL1 is brought high, as illustrated in the timing diagram 250 of FIG. 4. This provides a voltage across the ferroelectric capacitor CFE3 such that the ferroelectric capacitor CFE3 having the "high" polarization state will experience a polarization reversal, causing the voltage on the internal node N2 to rise. With PL1 still high, the control circuit 220 brings SRAM N ENABLE and SRAM N DISABLE high to ground the node NMCN, and also pulls SRAM P ENABLE and SRAM P DISABLE low to bring the node PMCN to VDD, and thereafter the plateline signal PL1 is again brought low. In this manner, the SRAM portion 204 has acquired a volatile data state corresponding to the non-volatile data from the portion 206', wherein the SRAM internal node N2 is again high (e.g., VDD) and the node N1 is low (e.g., VSS).

It is noted in FIGS. 24 that the present invention provides FERAM read loading capacitance using ferroelectric capacitors with the same polarization state. At each of the non-volatile portion nodes (e.g., nodes N3 and N4 in FIGS. 2A and 3A or nodes N1 and N2 in the directly coupled implementations of FIGS. 2B and 3C), two ferroelectric capacitors are biased to opposite polarities when a bias voltage is applied between the platelines PL1 and PL2 during the FERAM read operation. This generates more voltage difference between state "1" and "0" compared to the conventional device 2 of FIG. 1 and other possible solutions noted above, for example, where the capacitors CFE in the non-volatile portion 206' are of similar capacitance and voltage dependency.

Due to the hysteresis characteristics of the ferroelectric capacitors CFE, devices undergoing a polarization change have larger capacitance values compared with the ferroelectric capacitors that do not change polarization in a read operation. As a result, when a bias around the coercive voltage of the ferroelectric capacitors CFE in the non-volatile portion 206' is applied to one of them, most of the voltage is applied to another of the ferroelectric capacitors. Thus, during a read operation, the coupled ferroelectric capacitor pair CFE1 and CFE2 provide a large capacitance and a small capacitance combination, as will the coupled pair CFE3 and CFE4 in the non-volatile portion 206'. Thus, the signal voltage difference between the nodes N1 and N2 of the exemplary apparatus 202' is greater than in the conventional device 2 of FIG. 1.

In the conventional apparatus 2 of FIG. 1, on the other hand, a bias around the coercive voltage can only be applied to one of the two ferroelectric capacitors C1 or C2. Furthermore, situations can exist in the conventional device 2 of FIG. 1, where neither of the capacitors C1 and C2 are biased to the coercive voltage if the MOS capacitance of the SRAM portion 4 is small or the bias voltage is relatively low. In such a case, the ferroelectric capacitor bias may not reach the coercive voltage and hence, there will be little or no signal difference between the nodes N1 and N2. The larger voltage difference possible according to the present invention may also be employed to advantageously overcome the above mentioned sensitivity imbalance in the SRAM portion 204. Thus, an aspect of the invention provides methods for storing data in a semiconductor device, in which the second plateline signal PL2 is different from the first plateline signal PL1 in at least a portion of an FERAM read operation and/or an FERAM write operation.

Further, the invention may be advantageously employed to combat the above mentioned quick self-latch problems associated with conventional memories (e.g., FIG. 1). This may be accomplished, for instance, in the apparatus 202' of FIGS. 3C and. 3D through voltage control of the SRAM supply nodes (e.g., PMOS common node PMCN and the NMOS common node NMCN) via the first and second switching circuits comprising transistors Q11, Q12, Q13, and Q14. The PMOS and NMOS transistors of the SRAM portion 204 (e.g., QP1, QP2, QN1, and QN2) are set to an "off" state by biasing the PMCN to VSS and NMCN to VDD during signal charge readout from the ferroelectric capacitors, as illustrated in FIG. 4.

It is noted that many alternative implementations of the various aspects of the invention are possible, using variations in the illustrated structures and control signals. In this regard, the illustrated apparatus 102' and 202' of FIGS. 2B, 3C, and 3D may be operated according to different control and timing signals from those illustrated in the timing diagram 250 of FIG. 4 and others illustrated and described herein. Thus, it will be appreciated that persons of ordinary skill in the art may implement the exemplary control circuit 220' or variants thereof using any appropriate logic and/or timing circuitry to achieve the functionality set forth herein. Further, it will be understood that other implementations of memory apparatus are possible within the scope of the invention, for example, as illustrated in FIGS. 2A, 3A, and 3B, wherein the volatile portion internal nodes N1 and N2 are indirectly coupled with the non-volatile nodes N3 and N4, respectively, (e.g., via transistors Q9 and Q10) with appropriate plateline signals PL1 and PL2 and other control signals being provided for volatile and non-volatile memory operations. In this regard, the coupling transistors Q9 and Q10 may be employed to selectively couple or decouple the volatile and non-volatile portions 204 and 206, respectively, according to the FRAMEN signal from the control circuit 220 as illustrated in FIGS. 3A and 3B.

Figure 5:
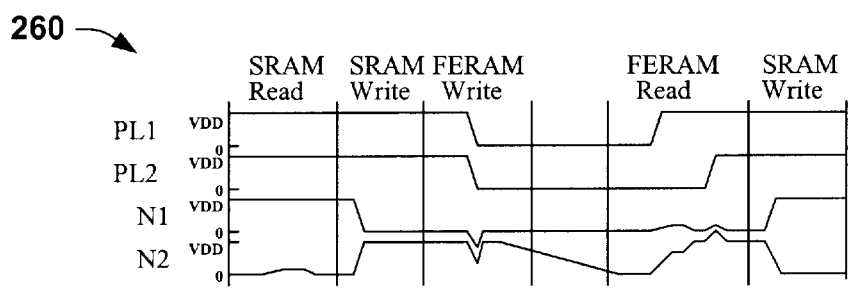
Figure 6:
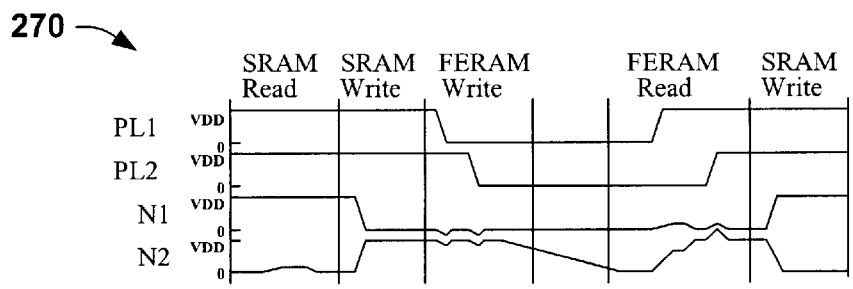

It is also noted in FIG. 4, that the response on the node N1 the first time the SRAM is written following the FERAM read operation is slow. Referring also to FIGS. 5 and 6, two different approaches for operating the apparatus 202' of FIGS. 3C and 3D are illustrated in timing diagrams 260 and 270, respectively. As one possible solution, the volatile and non-volatile portions 204 and 206', respectively, may be coupled during volatile (e.g., SRAM) operations, where the platelines PL1 and PL2 are held high (e.g., VDD) during SRAM read and SRAM write operations, as illustrated in FIG. 5. In this manner, the speed of the SRAM write following the FERAM read operation is improved, wherein the plateline PL2 is brought high after the plateline PL1 is brought high, through appropriate timing control in the control circuit 220'. In this implementation, the ferroelectric capacitor polarization changes by drawing current through the SRAM NMOS transistor QN2 when the VDD plateline bias is used, whereas VSS plateline biasing requires current from the SRAM PMOS transistors, which tend to be weaker than NMOS transistors.

In another possible variation, the plateline bias control illustrated in the timing diagram 270 of FIG. 6 improves the write speed, and also reduces coupling noise on the internal nodes N1 and N2 shown in FIGS. 4 and 5 during the FERAM write operation. This coupling noise is due to plateline bias change on PL1 and PL2 (changed at the same time in FIGS. 4 and 5). As seen in FIG. 6, however, the plateline PL1 may be brought low before bringing PL2 low during the FERAM write operation (e.g., staggered plateline bias approach), to reduce the internal SRAM node coupling noise. Refinements such as those illustrated in FIGS. 5 and 6, as well as other variations in the operation of the apparatus 202 or 202' and other devices may be made, for example, through adjustments in the design and/or operation of the control circuits 220 or 220', respectively.

Figure 7A:
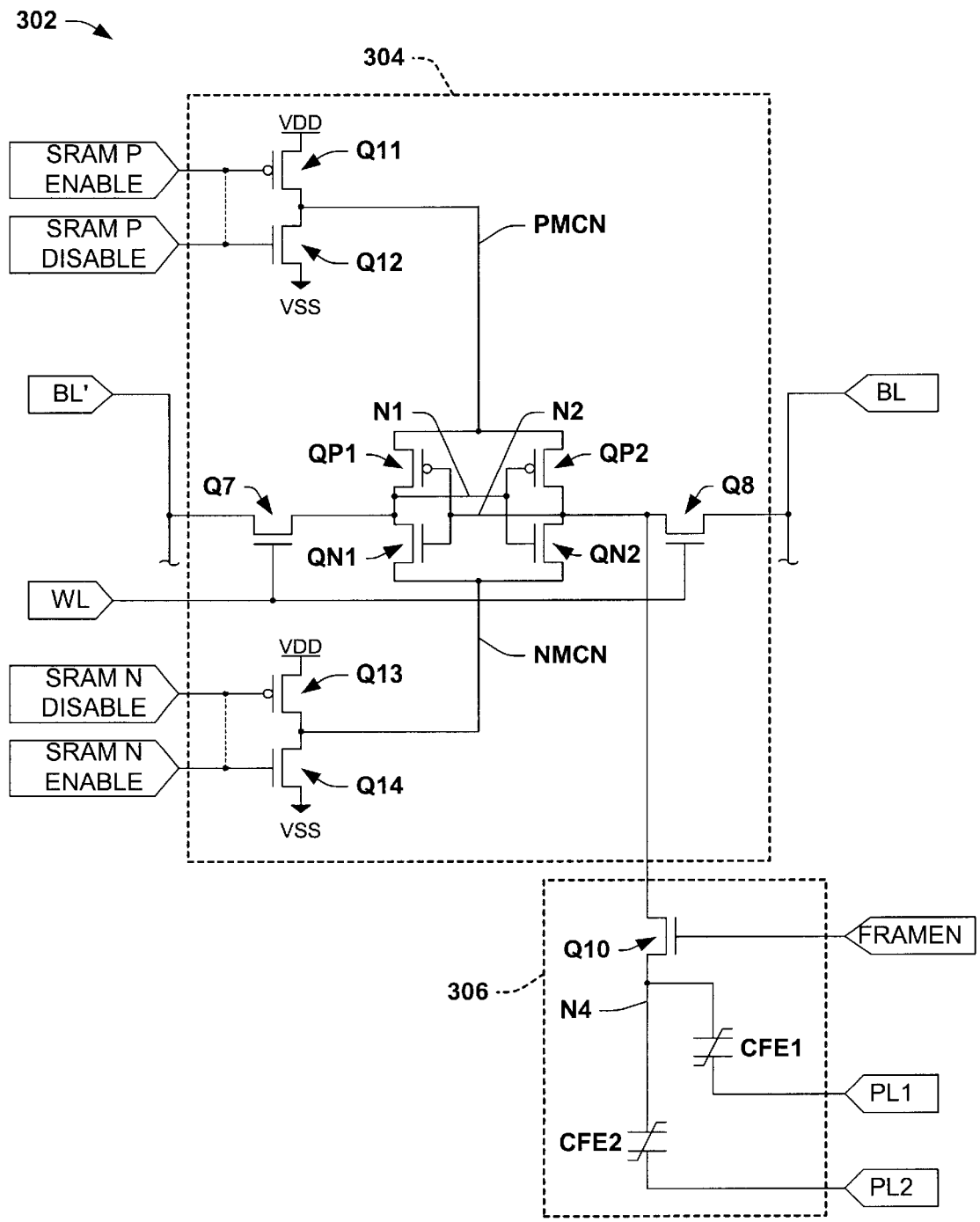
FIG. 7A is a schematic diagram illustrating another exemplary memory apparatus in accordance with the invention.
Figure 7B:
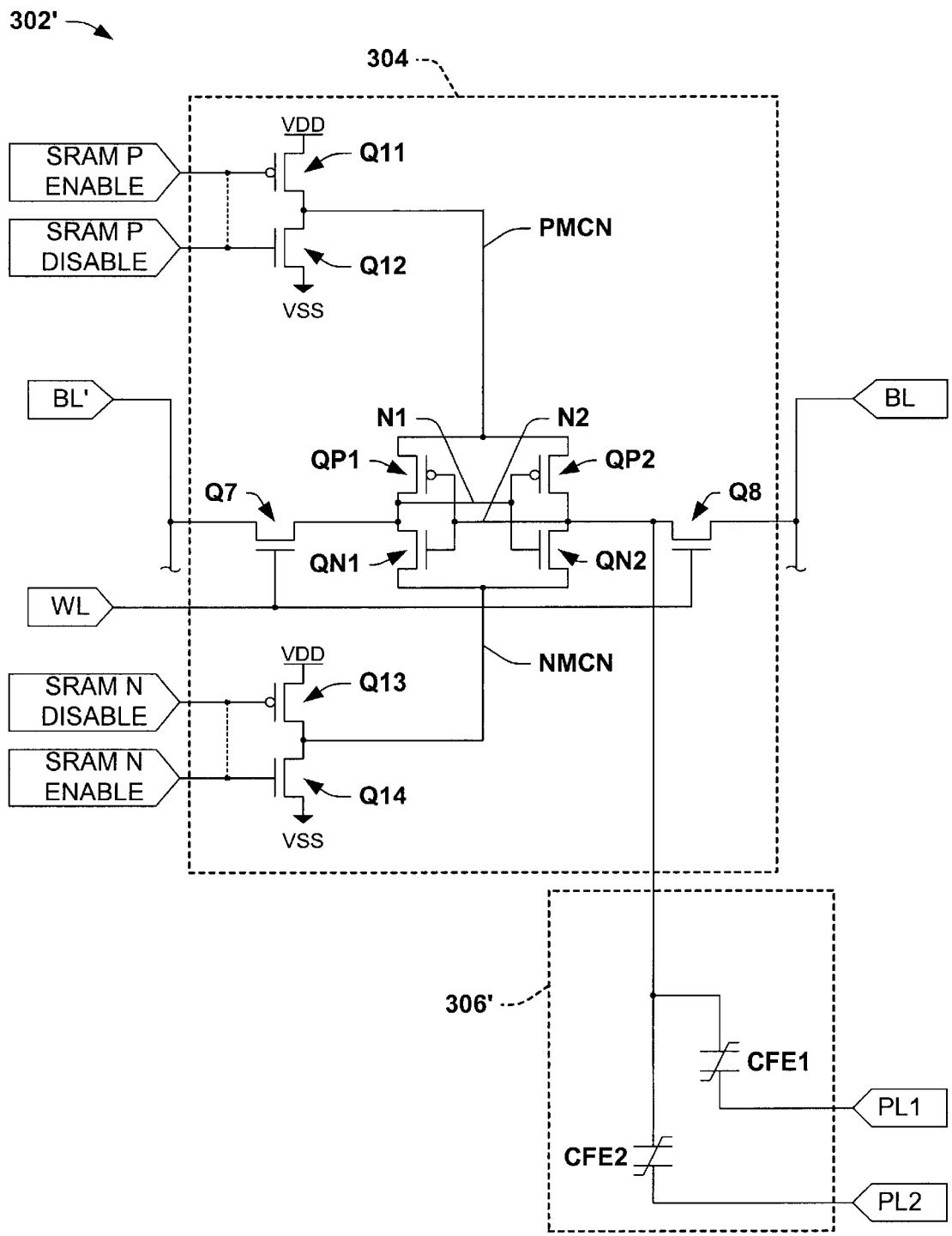
FIG. 7B is a schematic diagram illustrating still another exemplary memory apparatus in accordance with the invention.
Figure 8:
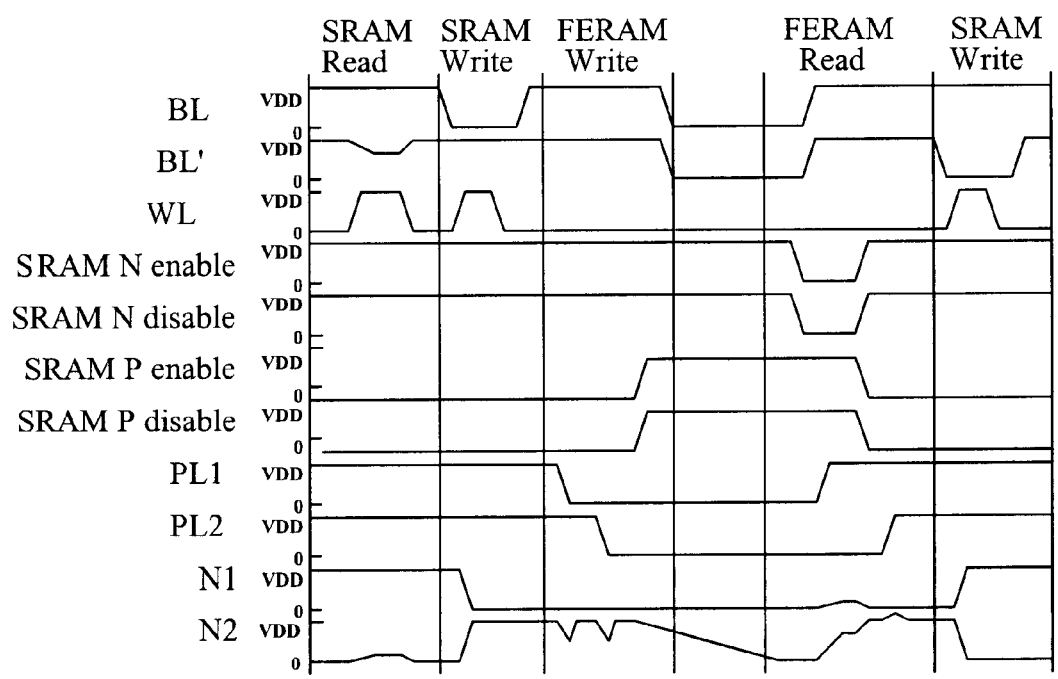
FIG. 8 is an exemplary waveform timing diagram illustrating operation of the exemplary apparatus of FIG. 7B.

Referring now to FIGS. 7A, 7B, and 8, another aspect of the invention provides memory apparatus 302 and 302' in FIGS. 7A and 7B, respectively, for storing volatile and non-volatile data in a semiconductor device. The memory apparatus 302 in FIG. 7A is similar in many respects to the apparatus 302' of FIG. 7B, wherein the apparatus 302 further comprises coupling transistor Q10 for selectively coupling volatile and non-volatile portions 304 and 306 thereof according to a control signal FRAMEN from a control circuit (not shown). The following describes operation of the exemplary apparatus 302' in FIG. 7B, from which those of ordinary skill in the art will appreciate the operation of the apparatus 302 as well.

The apparatus 302' in FIG. 7B comprises an SRAM cell 304 with first and second internal nodes N1 and N2, respectively, and first and second supply nodes PMCN and NMCN, respectively, similar to the volatile portion 204 of FIGS. 3A and 3C above. The apparatus 302' further comprises a non-volatile portion 306' for storing a binary non-volatile data state. The exemplary non-volatile portion 306' comprises first and second ferroelectric capacitors CFE1 and CFE2 directly coupled with the second internal node N2 of the SRAM memory cell 304 (e.g., whereas the alternative implementation in FIG. 7A selectively couples the node N2 with a non-volatile portion node N4 via a coupling transistor Q10). As with the apparatus 202' above, the capacitors CFE1 and CFE2 in FIG. 7B have common terminals coupled together, with the other terminal of CFE1 being coupled with a first plateline signal PL1 from a control circuit (not shown), and the other capacitor CFE2 being coupled with a second plateline signal PL2. Alternate implementations of this aspect of the invention are possible, for example, wherein the non-volatile portion 306 and the ferroelectric capacitors CFE1 and CFE2 thereof are coupled instead to the first SRAM internal node N1.

Operation of the exemplary apparatus 302' of FIG. 7B is further illustrated by a timing diagram 350 in FIG. 8. Volatile SRAM operations (e.g., SRAM read and SRAM write operations) are essentially the same in the apparatus 302' as in the apparatus 202' of FIG. 3C. In an FERAM write operation, data from the volatile portion 304 is copied to or written to the ferroelectric capacitors CFE1 and CFE2. In one example, the volatile data in the SRAM portion 304 is such that node N1 is at a low voltage level (VSS) and node N2 is at a high voltage level (VDD). Plateline PL1 is initially pulled low, and a short time later PL2 is pulled low. This provides a potential across the ferroelectric capacitors CFE1 and CFE2 with PMCN pulled high through Q11 and NMCN pulled low through Q14, by which the capacitors CFE1 and CFE2 acquire a "high" polarization state. Thereafter, the SRAM P ENABLE and SRAM P DISABLE signals are brought high to ground the SRAM supply node PMCN through Q12. Alternatively, where the opposite SRAM data is being written to the non-volatile portion 304, the ferroelectric capacitors CFE1 and CFE2 are polarized in the opposite direction during the time when PL1 and PL2 are high, respectively, with a low voltage on the internal node N2.

In an FERAM read operation, the internal nodes N1 and N2 are precharged to ground, and the platelines PL1 and PL2 are initially held low, after which the wordline WL is brought low to turn Q7 and Q8 off. With SRAM P ENABLE and SRAM P DISABLE high, SRAM N ENABLE and SRAM N DISABLE are brought low to pull the node NMCN to VDD through Q13. The plateline signal PL1 is brought high, as illustrated in the timing diagram 350 of FIG. 8, thereby providing a voltage across the ferroelectric capacitor CFE1 such that the ferroelectric capacitor CFE1 having the "high" polarization state will experience a polarization reversal, causing the voltage on the internal node N2 to rise while N1 remains low. With PL1 still high, SRAM N ENABLE and SPAM N DISABLE are brought high (e.g., to ground the node NMCN through Q14), and SRAM P ENABLE and SRAM P DISABLE are brought low (e.g., to bring the node PMCN to VDD through Q11), after which PL2 is also brought high. In this manner, the SRAM portion 304 acquires a volatile data state corresponding to the non-volatile data from the portion 306', wherein N2 is high and N1 is low.

Complementary operation is attained where the ferroelectric capacitors CFE1 and CFE2 are previously polarized to a "low" state. In this situation, the ferroelectric capacitors will not undergo a polarization switch, and the SRAM internal nodes N1 and N2 are brought high and low, respectively. Furthermore, equivalent operation in volatile and non-volatile modes is obtained where the non-volatile portion 306' is alternatively coupled with the internal node N1.

It is noted in the apparatus 302' of FIG. 7B (e.g., and in the apparatus 302 of FIG. 7A), that the die area occupied is commensurate with that of the conventional apparatus 2 of FIG. 1, wherein only two ferroelectric capacitors are required.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature: may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A memory apparatus for storing data in a semiconductor device, the memory apparatus comprising:
    a volatile portion comprising first and second internal nodes, the volatile portion being adapted to store a binary volatile data state; and
    a non-volatile portion coupled with the first and second internal nodes of the volatile portion and adapted to store a binary non-volatile data state, the non-volatile portion comprising:
        first and second ferroelectric capacitors coupled with the first internal node of the volatile portion, and
        third and fourth ferroelectric capacitors coupled with the second internal node of the volatile portion;
    wherein the volatile portion comprises an SRAM cell comprising:
        a first inverter comprising a first input coupled with the second internal node and a first output coupled with the first internal node; and
        a second inverter comprising a second input coupled with the first internal node and a second output coupled with the second internal node;
    wherein the first inverter comprises a first PMOS transistor selectively coupling the first internal node with a first supply node according to a voltage at the second internal node and a first NMOS transistor selectively coupling the first internal node with a second supply node according to the voltage at the second internal node;
    wherein the second inverter comprises a second PMOS transistor selectively coupling the second internal node with the first supply node according to a voltage at the first internal node and a second NMOS transistor selectively coupling the second internal node with the second supply node according to the voltage at the first internal node; and
    wherein the volatile portion further comprises a first switching circuit adapted to selectively couple the first supply node with one of a supply voltage and a ground voltage, and a second switching circuit adapted to selectively couple the second supply node with one of the supply voltage and the ground voltage.

2. The apparatus of claim 1, wherein the first switching circuit comprises a first switching device selectively coupling the first supply node with the supply voltage according to a first SRAM enable signal, and a second switching device selectively coupling the first supply node with the ground voltage according to a first SRAM disable signal, and wherein the second switching circuit comprises a third switching device selectively coupling the second supply node with the supply voltage according to a second SRAM disable signal, and a fourth switching device selectively coupling the second supply node with the ground voltage according to a second SRAM enable signal.

3. The apparatus of claim 2, further comprising a control circuit adapted to selectively provide the first and second SRAM enable signals and the first and second SRAM disable signals.

4. The apparatus of claim 1, wherein the first ferroelectric capacitor is coupled between the first internal node and a first plateline signal, wherein the second ferroelectric capacitor is coupled between the first internal node and a second plateline signal, wherein the third ferroelectric capacitor is coupled between the second internal node and the first plateline signal, wherein the fourth ferroelectric capacitor is coupled between the second internal node and the second plateline signal.

5. The apparatus of claim 4, wherein the non-volatile portion further comprises a coupling circuit adapted to selectively couple the first and second ferroelectric capacitors with the first internal node and to selectively couple the third and fourth ferroelectric capacitors with the second internal node according to a ferroelectric enable signal.

6. The apparatus of claim 5, wherein the coupling circuit comprises first and second NMOS coupling transistors, the first coupling transistor being adapted to selectively couple the first and second ferroelectric capacitors with the first internal node according to the ferroelectric enable signal and the second coupling transistor being adapted to selectively couple the third and fourth ferroelectric capacitors with the second internal node according to the ferroelectric enable signal.

7. The apparatus of claim 4, further comprising a control circuit adapted to selectively provide the first and second plateline signals.

8. The apparatus of claim 1, wherein the non-volatile portion further comprises a coupling circuit adapted to selectively couple the first and second ferroelectric capacitors with the first internal node and to selectively couple the third and fourth ferroelectric capacitors with the second internal node according to a ferroelectric enable signal.

9. The apparatus of claim 8, wherein the coupling circuit comprises first and second NMOS coupling transistors, the first coupling transistor being adapted to selectively couple the first and second ferroelectric capacitors with the first internal node according to the ferroelectric enable signal and the second coupling transistor being adapted to selectively couple the third and fourth ferroelectric capacitors with the second internal node according to the ferroelectric enable signal.

10. The apparatus of claim 8, further comprising a control circuit adapted to selectively provide the ferroelectric enable signal.

11. A memory apparatus for storing data in a semiconductor device, the memory apparatus comprising:

an SRAM memory cell comprising first and second internal nodes and first and second supply nodes, the SRAM cell being adapted to store a binary volatile data state;

a non-volatile memory cell coupled with the first and second internal nodes of the SRAM cell and adapted to store a binary non-volatile data state, the non-volatile memory cell comprising:

first and second ferroelectric capacitors coupled with the first internal node of the SRAM memory cell, and third and fourth ferroelectric capacitors coupled with the second internal node of the SRAM memory cell;

a first switching circuit connected to the first supply node, a supply voltage, and a ground voltage, the first switching circuit being adapted to selectively couple the first supply node with one of the supply voltage and the ground voltage; and a second switching circuit connected to the second supply node, the supply voltage, and the ground voltage, the second switching circuit being adapted to selectively couple the second supply node with one of the supply voltage and the ground voltage.

12. The apparatus of claim 11, wherein the first switching circuit comprises a first switching device selectively coupling the first supply node with the supply voltage according to a first SRAM enable signal, and a second switching device selectively coupling the first supply node with the ground voltage according to a first SRAM disable signal, and wherein the second switching circuit comprises a third switching device selectively coupling the second supply node with the supply voltage according to a second SRAM disable signal, and a fourth switching device selectively coupling the second supply node with the ground voltage according to a second SRAM enable signal.

13. The apparatus of claim 12, further comprising a control circuit adapted to selectively provide the first and second SRAM enable signals and the first and second SRAM disable signals.

14. A memory apparatus for storing data in a semiconductor device, the memory apparatus comprising:

an SRAM memory cell comprising first and second internal nodes and first and second supply nodes, the SRAM cell being adapted to store a binary volatile data state; and first and second ferroelectric capacitors coupled with one of the first and second internal nodes of the SRAM memory cell, the ferroelectric capacitors being adapted to store a binary non-volatile data state;

wherein the SRAM cell further comprises a first switching circuit adapted to selectively couple the first supply node with one of a supply voltage and a ground voltage, and a second switching circuit adapted to selectively couple the second supply node with one of the supply voltage and the ground voltage.

15. The apparatus of claim 14, wherein the SRAM cell comprises a first inverter comprising a first input coupled with the second internal node and a first output coupled with the first internal node; and a second inverter comprising a second input coupled with the first internal node and a second output coupled with the second internal node.

16. The apparatus of claim 15, wherein the first inverter comprises a first PMOS transistor selectively coupling the first internal node with a first supply node according to a voltage at the second internal node and a first NMOS transistor selectively coupling the first internal node with a second supply node according to the voltage at the second internal node, and wherein the second inverter comprises a second PMOS transistor selectively coupling the second internal node with the first supply node according to a voltage at the first internal node and a second NMOS transistor selectively coupling the second internal node with the second supply node according to the voltage at the first internal node.

17. The apparatus of claim 14, wherein the first switching circuit comprises a first switching device selectively coupling the first supply node with the supply voltage according to a first SRAM enable signal, and a second switching device selectively coupling the first supply node with the ground voltage according to a first SRAM disable signal, and wherein the second switching circuit comprises a third switching device selectively coupling the second supply node with the supply voltage according to a second SRAM disable signal, and a fourth switching device selectively coupling the second supply node with the ground voltage according to a second SRAM enable signal.

18. The apparatus of claim 17, further comprising a control circuit adapted to selectively provide the first and second SRAM enable signals and the first and second SRAM disable signals.

19. The apparatus of claim 17, wherein the first ferroelectric capacitor is coupled between the one of the first and second internal nodes and a first plateline signal, and wherein the second ferroelectric capacitor is coupled between the one of the first and second internal nodes and a second plateline signal.

20. The apparatus of claim 19, wherein the non-volatile portion further comprises a coupling circuit adapted to selectively couple the first and second ferroelectric capacitors with the one of the first and second internal nodes according to a ferroelectric enable signal.

21. The apparatus of claim 14, wherein the first ferroelectric capacitor is coupled between the one of the first and second internal nodes and a first plateline signal, and wherein the second ferroelectric capacitor is coupled between the one of the first and second internal nodes and a second plateline signal.

22. The apparatus of claim 21, wherein the non-volatile portion further comprises a coupling circuit adapted to selectively couple the first and second ferroelectric capacitors with the one of the first and second internal nodes according to a ferroelectric enable signal.

* * * * *